United States Patent
Hu

(10) Patent No.: US 9,464,470 B2
(45) Date of Patent: Oct. 11, 2016

(54) HINGE MODULE AND ELECTRONIC DEVICE USING THE SAME

(71) Applicant: Acer Incorporated, New Taipei (TW)

(72) Inventor: Li-Hau Hu, New Taipei (TW)

(73) Assignee: Acer Incorporated, New Taipei (TW)

( * ) Notice: Subject to any disclaimer, the term of this patent is extended or adjusted under 35 U.S.C. 154(b) by 12 days.

(21) Appl. No.: 14/598,231

(22) Filed: Jan. 16, 2015

(65) Prior Publication Data

US 2016/0153220 A1 Jun. 2, 2016

(30) Foreign Application Priority Data

Dec. 1, 2014 (TW) .............................. 103141591 A

(51) Int. Cl.
*E05D 3/10* (2006.01)
*E05D 3/02* (2006.01)
*E05D 11/06* (2006.01)
(Continued)

(52) U.S. Cl.
CPC ................. *E05D 3/022* (2013.01); *E05D 5/14* (2013.01); *E05D 11/04* (2013.01); *E05D 11/06* (2013.01); *G06F 1/1618* (2013.01);
(Continued)

(58) Field of Classification Search
CPC .. G06F 1/1616; G06F 1/1679; G06F 1/1681; G06F 1/1622; G06F 1/162; H05K 5/0226; Y10T 16/547; Y10T 16/5472; E05D 3/122; E05D 3/12; E05D 3/16; E05D 3/18; E05D 3/06; E05D 3/32; E05D 3/10; E05D 11/1021; E05D 11/1078; E05Y 2900/20; E05Y 2900/60; E05Y 2900/606; E04M 1/022; E04M 1/0214; E04M 1/0216; E04M 1/0212; E04M 1/0225; E04M 1/0222
USPC ......... 16/327, 331, 333, 338, 340, 366, 354, 16/357, 360, 346, 345, 368, 369, 286, 291, 16/293, 294, 296, 367; 361/679.08, 361/679.11, 679.02, 679.15, 679.27, 361/679.21, 679.09, 679.22; 455/90.3, 455/575.1, 575.3, 575.8; 379/433.12, 379/433.13; 348/373, 333.01, 333.06, 794; 248/274.1, 284.1, 286.1, 287.1, 419, 248/420

See application file for complete search history.

(56) References Cited

U.S. PATENT DOCUMENTS 2,118,950 A * 5/1938 Stannard .................. E05F 3/20
    16/256
4,788,746 A * 12/1988 Idler ....................... B64G 1/222
    16/297

(Continued)

FOREIGN PATENT DOCUMENTS

TW     578854     3/2004
TW     M285184     1/2006

*Primary Examiner* — Chuck Mah
(74) *Attorney, Agent, or Firm* — Jianq Chyun IP Office

(57) ABSTRACT

A hinge module including a first shaft member, a second shaft member, a sleeve and at least a first ball is provided. The first shaft member is rotatably inserted in the second shaft member along an axis. The sleeve disposed between the first shaft member and the second shaft member along the axis, and the sleeve is connected to the second shaft member. The sleeve has at least one guide groove, which extends around the axis and has at least one gap along the axis. The first ball disposed on the first shaft member, and the first ball rotatably coupled to the guide groove. When the first shaft member is relatively rotated with the second shaft member around the axis, the first shaft member relatively moves the gap along the axis by rolling the first ball in the guide groove. An electronic device is also provided.

14 Claims, 6 Drawing Sheets

(51) Int. Cl.
*E05D 5/14* (2006.01)
*E05D 11/04* (2006.01)
*G06F 1/16* (2006.01)
*H04M 1/02* (2006.01)
*H05K 5/02* (2006.01)

(52) U.S. Cl.
CPC ........ *G06F 1/1681* (2013.01); *H04M 1/0212* (2013.01); *H05K 5/0226* (2013.01); *E05D 2011/045* (2013.01)

(56) References Cited

U.S. PATENT DOCUMENTS

| | | | |
|---|---|---|---|
| 6,256,837 B1* | 7/2001 | Lan | B60R 11/0235 16/334 |
| 6,850,407 B2* | 2/2005 | Tanimoto | G06F 1/162 16/321 |
| 7,076,837 B2* | 7/2006 | Liao | G06F 1/162 16/312 |
| 2004/0068833 A1* | 4/2004 | Sawa | E05F 3/20 16/60 |
| 2004/0200036 A1 | 10/2004 | Liao | |
| 2005/0102799 A1* | 5/2005 | Huang | G06F 1/1681 16/367 |
| 2005/0125950 A1* | 6/2005 | Su | G06F 1/1679 16/302 |
| 2006/0198093 A1* | 9/2006 | Chuang | E05D 3/10 361/679.09 |
| 2007/0065090 A1 | 3/2007 | Lin | |
| 2008/0000050 A1* | 1/2008 | Hsu | E05D 3/10 16/367 |
| 2008/0078060 A1* | 4/2008 | Chen | G06F 1/1681 16/367 |
| 2008/0078061 A1* | 4/2008 | Hsu | G06F 1/162 16/367 |
| 2008/0120805 A1 | 5/2008 | Su | |
| 2009/0241289 A1* | 10/2009 | Choi | E05F 3/20 16/275 |
| 2010/0005626 A1* | 1/2010 | Wang | G06F 1/162 16/367 |
| 2010/0011539 A1* | 1/2010 | Huang | G06F 1/162 16/367 |
| 2010/0043175 A1* | 2/2010 | Wang | G06F 1/162 16/343 |
| 2010/0263166 A1* | 10/2010 | Wang | G06F 1/162 16/297 |
| 2010/0319260 A1* | 12/2010 | Sawa | E05F 1/1223 49/326 |
| 2011/0023270 A1* | 2/2011 | Kim | E05D 11/1014 16/297 |

\* cited by examiner

HINGE MODULE AND ELECTRONIC DEVICE USING THE SAME

CROSS-REFERENCE TO RELATED APPLICATION

This application claims the priority benefit of Taiwan application serial no. 103141591, filed on Dec. 1, 2014. The entirety of the above-mentioned patent application is hereby incorporated by reference herein and made a part of this specification.

BACKGROUND

1. Field of the Invention

The invention is directed to a hinge module and more particularly, to a hinge module for an electronic device.

2. Description of Related Art

Along with development of technologies, portable electronic devices, such as notebook computers, tablet computers and smart phones are widely applied in our daily life. In order to enhance the application of the portable electronic devices, a notebook computer with a tablet mode and a computer mode has been further developed. Such type of notebook computer can serve as a general computer when a user directly open it, and can serve as a table mode when the user turns over the upper body of the notebook computer equipped with a display, so as to provide the user with various usage experiences.

However, in order to provide a better closing effect when the notebook computer is retracted, a minor offset between the upper body equipped with the display and the lower body often leads to friction therebetween when the display of the notebook computer is turned over, such that components on the lower body, such as a keyboard, may be damaged, while the display on the upper body may also be scratched. Nevertheless, a large gap between the upper and the lower bodies usually leads to bad closing effect of the notebook computer, which results in incapability of providing a good housing effect.

SUMMARY

The invention is directed to a hinge module, including a first shaft member, a second shaft member, a sleeve and at least one first ball. The first shaft member is rotatably inserted in the second shaft member along an axis. The sleeve is disposed between the first shaft member and the second shaft member along the axis, and connected to the second shaft member. The sleeve has at least one guide groove extends around the axis and has at least one gap along the axis. The at least one first ball is disposed on the first shaft member and rotatably coupled to the guide groove. When the first shaft member is rotated relatively to the second shaft member around the axis, the first shaft member is rotated around the axis relatively to the second shaft member to move the gap by rolling the first ball in the guide groove.

The invention is directed to an electronic device, including a first body, a second body and a hinge module. The hinge module includes a first shaft member, a second shaft member, a sleeve and at least one first ball. The first shaft member is connected to the first body, the second shaft member is connected to the second body, and the first shaft member is rotatably inserted in the second shaft member along an axis, such that the first body is rotated around the axis relatively to the second body. The sleeve is disposed between the first shaft member and the second shaft member along the axis, and connected to the second shaft member. The sleeve has at least one guide groove extending around the axis. The at least one first ball is disposed on the first shaft member and rotatably coupled to the guide groove. When the first shaft member is rotated relatively to the second shaft member around the axis, the first shaft member is rotated around the axis relatively to the second shaft member by rolling the first ball in the guide groove, so as to change a distance between the first body and the second body.

To sum up, in the hinge module provided by the invention, while the first shaft member and the second shaft member are rotated around an axis relatively to each other, a displacement occurs between the first shaft member and the second shaft member. In the electronic device of the invention, while the first body and the second body are rotated around an axis relatively to each other, a distance between the first body and the second body is changed.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
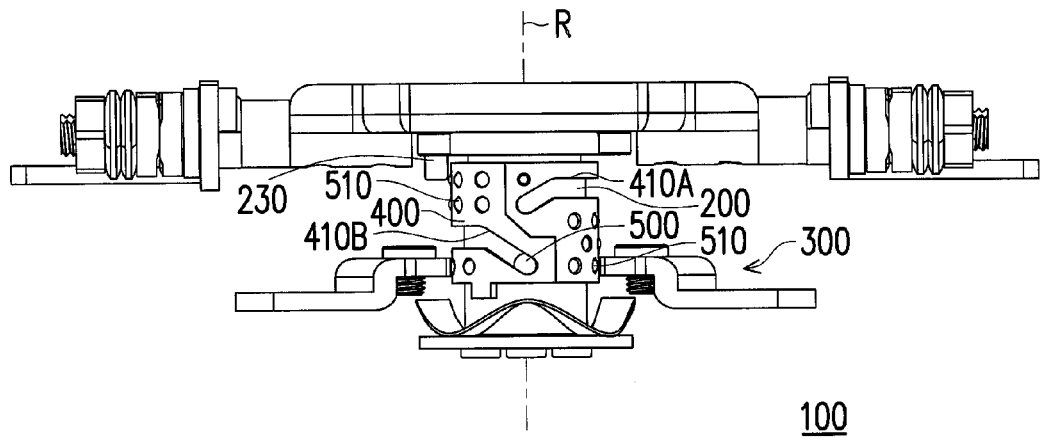
FIG. 1A through FIG. 1C are schematic diagrams illustrating a hinge module in three types of rotation states according to an embodiment of the invention.
Figure 1B:
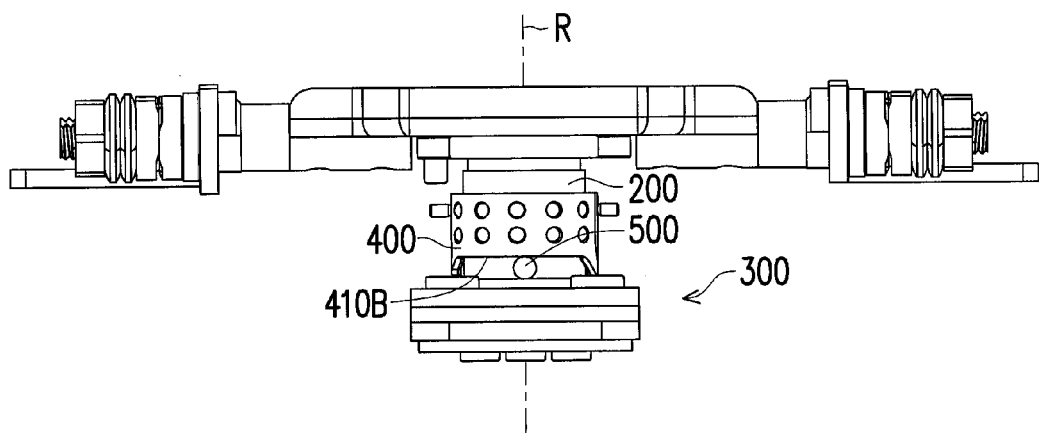
Figure 1C:
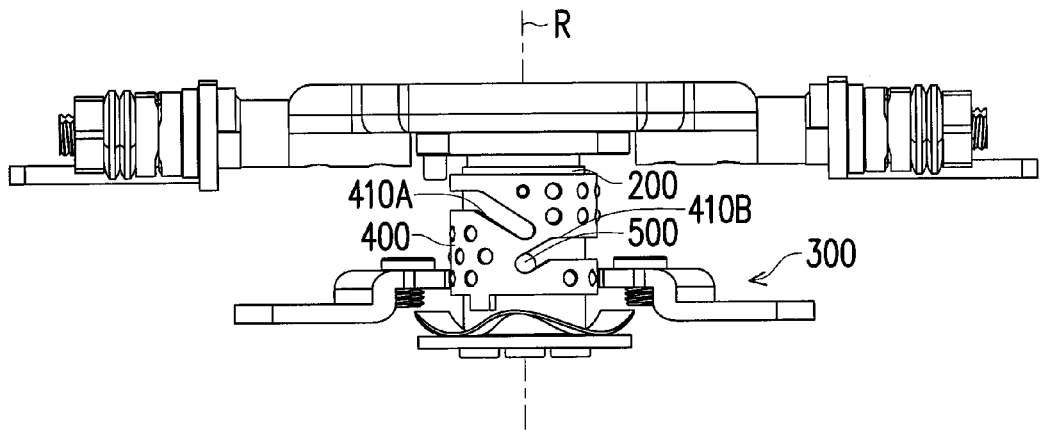
Figure 2A:
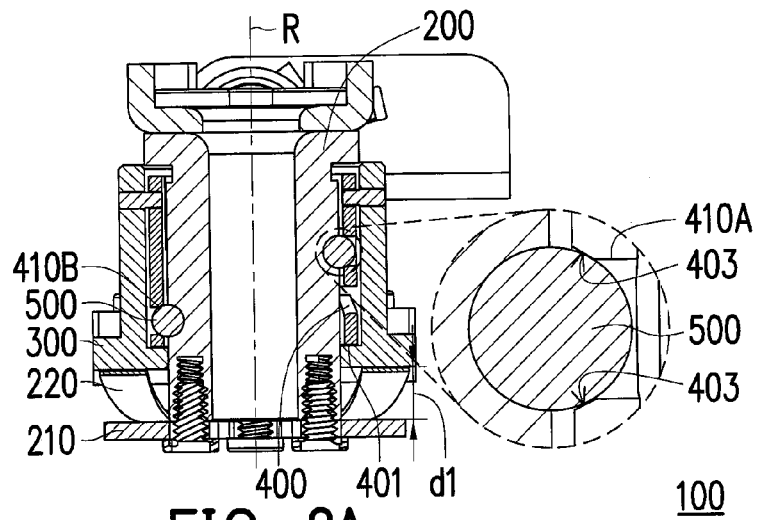
FIG. 2A through FIG. 2C are cross-sectional diagrams along connection lines between a first ball and an axis depicted in FIG. 1A through FIG. 1C.
Figure 2B:
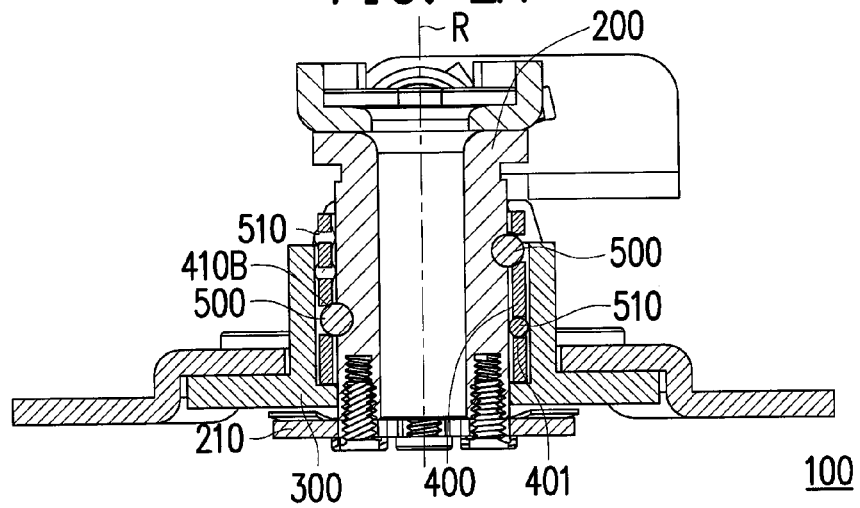
Figure 2C:
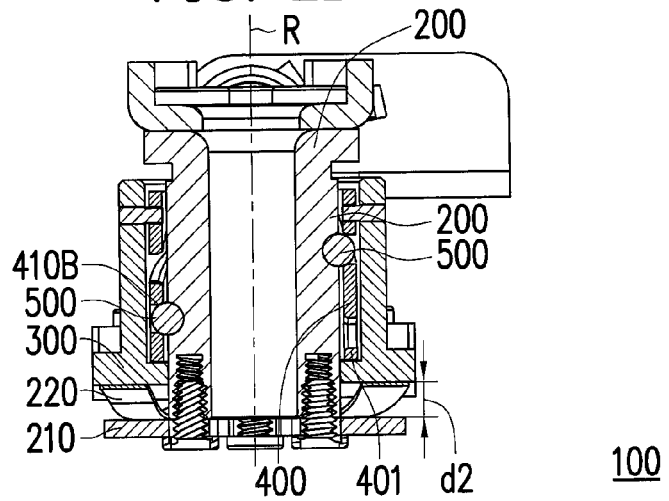

FIG. 1A through FIG. 1C are schematic diagrams illustrating a hinge module in three types of rotation states according to an embodiment of the invention. FIG. 2A through FIG. 2C are cross-sectional diagrams along connection lines between a first ball and an axis depicted in FIG. 1A through FIG. 1C. It is to be mentioned that part of components are omitted in FIG. 1A through FIG. 1C for illustrating connection between a first shaft member and a second shaft member more clearly, which construes no limitations to the invention. Referring to FIG. 1A and FIG. 2A, in the present embodiment, a hinge module 100 includes a first shaft member 200, a second shaft member 300, a sleeve 400 and at least one first ball 500 (illustrated as two for example, but the invention is not limited thereto). The first shaft member 200 is rotatably inserted in the second shaft member 300 along an axis R. The sleeve 400 is disposed between the first shaft member 200 and the second shaft member 300 along the axis R and connected to the second shaft member 300.

Figure 3:
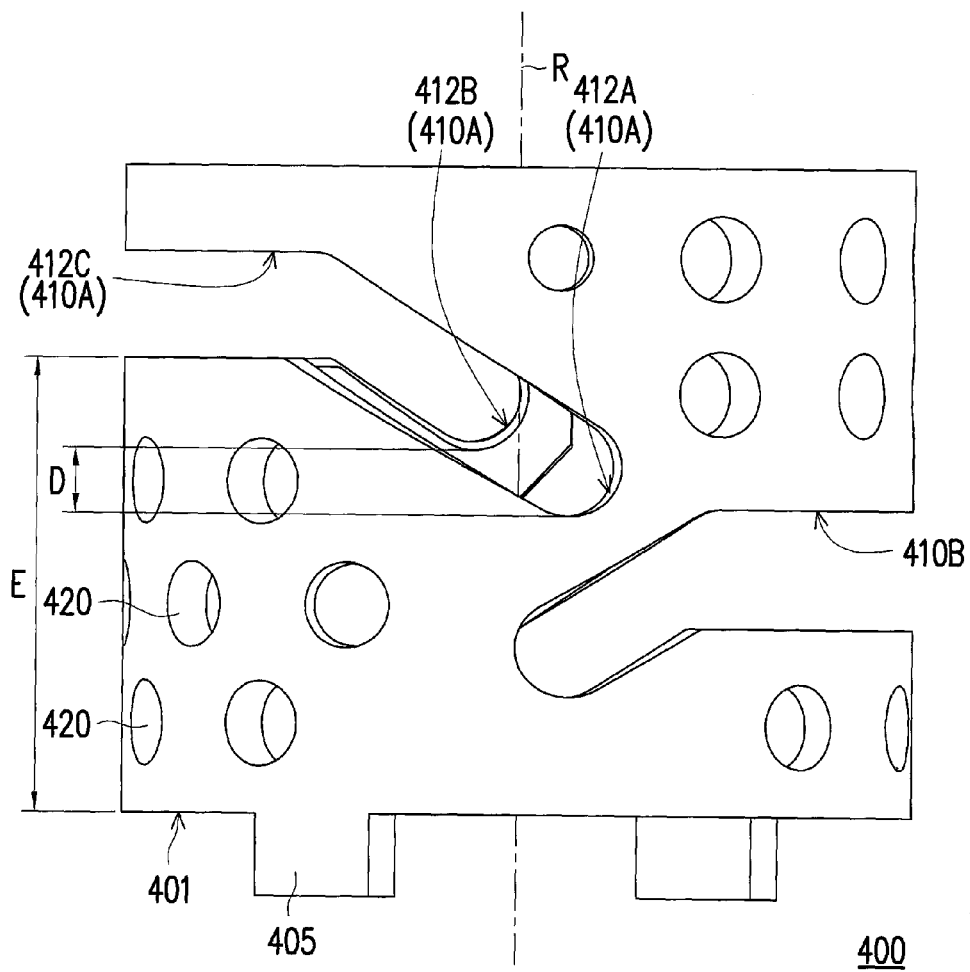
FIG. 3 is a schematic diagram illustrating the sleeve depicted in FIG. 1A through FIG. 1C.

FIG. 3 is a schematic diagram illustrating the sleeve depicted in FIG. 1A through FIG. 1C. Referring to FIG. 3, in the present embodiment, the sleeve 400 has at least one guide groove (illustrated as two guide grooves 410A and 410B in the present embodiment, but the invention is not limited thereto). The guide grooves 410A and 410B extend around the axis R respectively, wherein each of the guide grooves 410A and 410B has a first gap D between terminal ends along the axis R. Referring to FIG. 2A through FIG. 2C and FIG. 3 simultaneously, each first ball 500 is disposed on the first shaft member 200, and the first ball 500 is rotatably coupled to the guide grooves 410A and 410B. When the first shaft member 200 is rotated relatively to the second shaft member 300 around the axis R, the first shaft member 200 is rotated relatively to the second shaft member 300 around the axis R to move along the axis R a distance equal to the first gap D by rolling the first balls 500 in the guide grooves 410A and 410B. Each first ball 500 may be, for example, rotatably disposed in a cavity on a cylindrical sidewall surface 240 of the first shaft member 200, but the invention is not limited thereto. In other embodiments, each first ball 500 may directly rolls on the surface 240.

In detail, referring to the partially enlarged diagram illustrated in FIG. 2A, the guide groove 410A has a carrying surface 403 facing the first shaft member 200, and each first ball 500 rotatably contacts with the carrying surface 403 and an outer surface of the first shaft member 200.

Namely, in the present embodiment, when each first ball 500 on the first shaft member 200 is located at one end of the each of the guide grooves 410A and 410B, as shown in FIG. 1A, a reference spacing d1 is between an end of the first shaft member 200 and an end of the second shaft member 300, and when each first ball 500 is located at the other end of each of the guide grooves 410A and 410B, as shown in FIG. 1C, a reference spacing d2 is between the end of the first shaft member 200 and the end of the second shaft member 300. Thus, when the first shaft member 200 and the second shaft member 300 are rotated, a distance therebetween is changed from the reference spacing d1 to the reference spacing d2. Namely, the first shaft member 200 and the second shaft member 300 has a relation expressed by d1−d2=D. Thus, as the first shaft member 200 and the second shaft member 300 in the hinge module 100 of the present embodiment are rotated to a certain angle with each other, a displacement occurs along the axis R between the first shaft member 200 and the second shaft member 300. In this circumstance, when two objects (not shown) are respectively connected to the first shaft member 200 and the second shaft member 300, the objects may be rotated relatively to each other around the axis R, and during the rotation, a relative distance between the two objects may be changed with the first gap D along the axis R.

The reference spacing does not refer to the absolute distance between the first shaft member 200 and the second shaft member 300, but merely refers to a distance between ends of two shaft members. The reference spacing referred to herein may also be used to describe a depth of the first shaft member 200 being inserted in the second shaft member 300

Referring again to FIG. 1A through FIG. 1C, in the present embodiment, the hinge module 100 further includes a plurality of second balls 510 rotatably embedded in the sleeve 400. Referring again to FIG. 2B, the second balls 510 rotatably contact with the first shaft member 200 and the second shaft member 300 to facilitate the rotation between the first shaft member 200 and the second shaft member 300 to provide a better rotation capability.

Figure 4A:
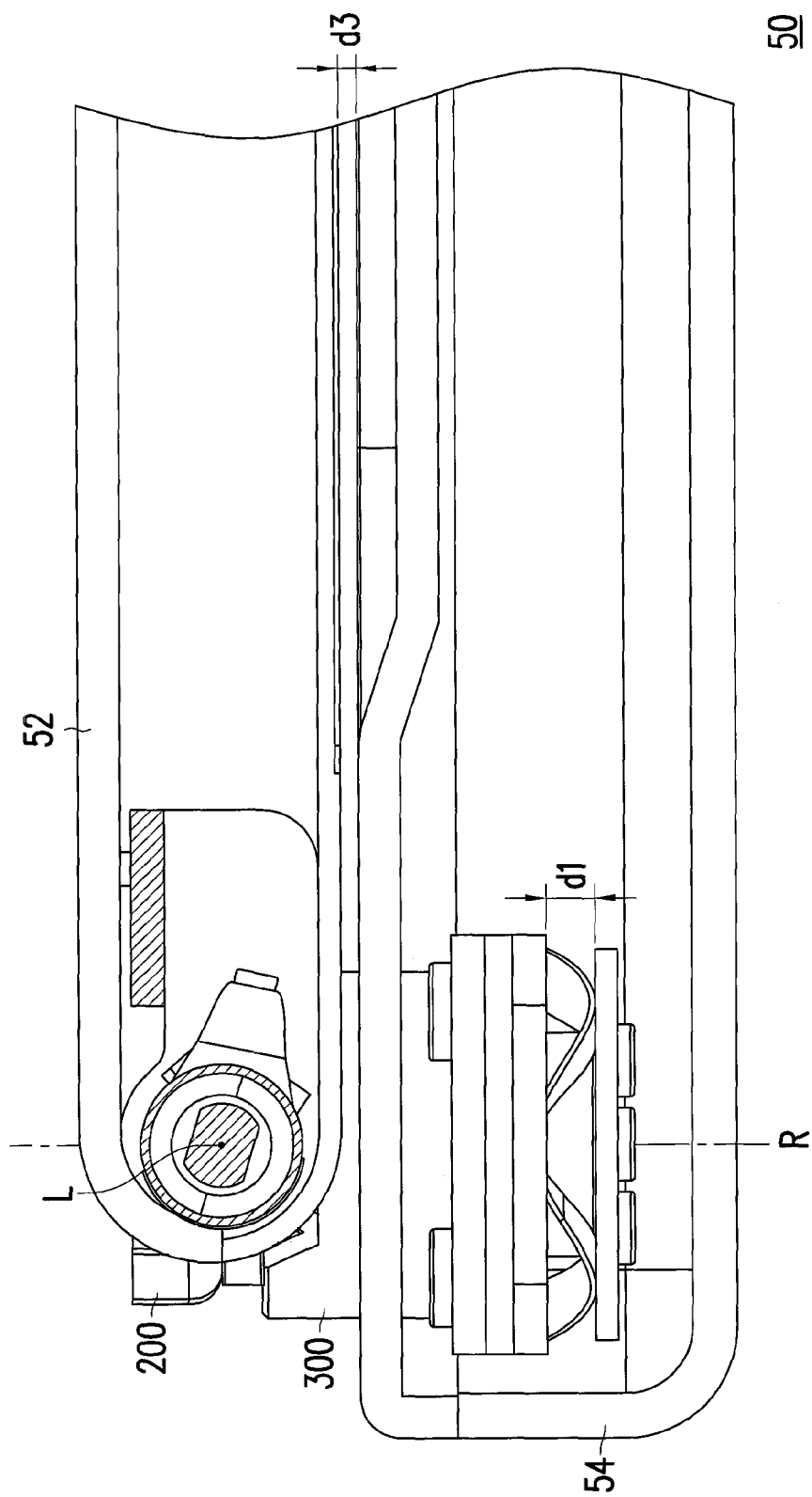
FIG. 4A and FIG. 4B are schematic diagrams illustrating an electronic device in two states according to an embodiment of the invention.
Figure 4B:
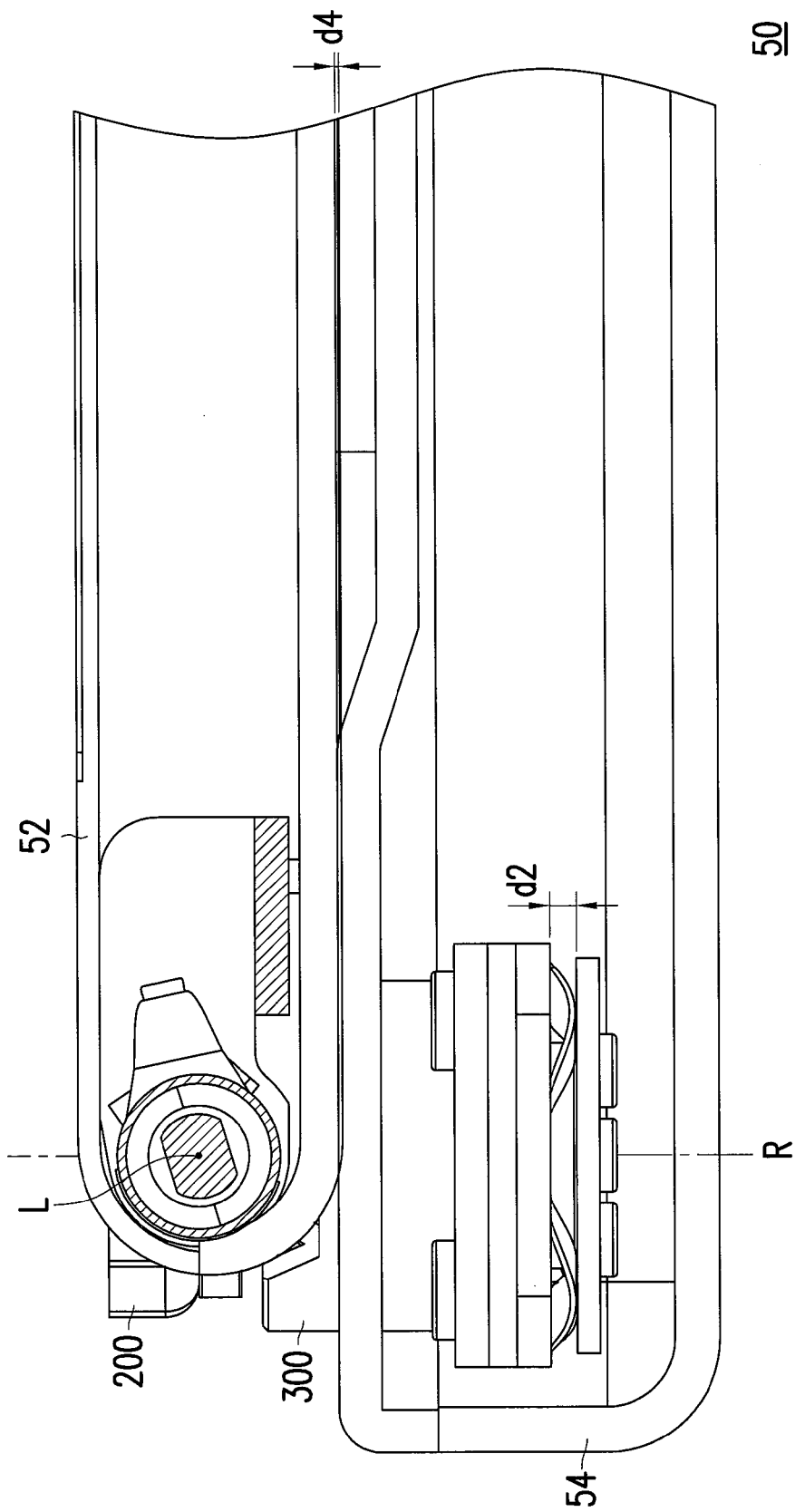

FIG. 4A and FIG. 4B are schematic diagrams illustrating an electronic device in two states according to an embodiment of the invention. It should be mentioned that each hinge module in an electronic device 50 illustrated in FIG. 4A and FIG. 4B is equivalent to the hinge module 100, and thus, the same reference numbers are used to represent the same components, in which the hinge module depicted in FIG. 4A corresponds to the hinge module depicted in FIG. 1A and FIG. 2A, and the hinge module depicted in FIG. 4B corresponds to the hinge module depicted in FIG. 1C and FIG. 2C. Referring to FIG. 4A and FIG. 4B, in an embodiment of the invention, the electronic device 50 includes a first body 52, a second body 54 and the hinge module 100. The first shaft member 200 is connected to the first body 52, and the second shaft member 300 is connected to the second body 54. The first shaft member 200 is rotatably inserted in the second shaft member 300 along the axis R, such that the first body 200 may be rotated relatively to the second body 300 around the axis R. Referring to FIG. 2A and FIG. 2C together, according to the description with respect to the hinge module 100 above, when the first body 52 is rotated relatively to the second body 54 around the axis R, the first shaft member 200 is rotated relatively to the second shaft member 300 around the axis R by rolling each first ball 500 in each of the guide grooves 410A and 410B, such that a distance between the first body 52 and the second body 54 is changed.

To be more specific, in the present embodiment, the reference spacing is changed from d1 to d2 while the hinge module 100 is rotated, i.e., the depth for the first shaft member 200 being inserted in the second shaft member 300 in the hinge module 100 is changed, such that an original spacing d3 between the first body 52 and the second body 54 is changed as a spacing d4 after the rotation. Thus, in the present embodiment, the electronic device 50 may have a smaller spacing when one side of the first body 52 having a thinner surface is bent toward the second body 54 and may have a larger spacing when the other side of the first body 52 having a thicker surface is bent toward the second body 54, such that the electronic device 50 may be safer during the rotation.

In detail, referring to FIG. 1A through FIG. 1C and FIG. 3, in an embodiment of the invention, the sleeve 400 is connected to the second shaft member 300 with a connecting side 401. In the present embodiment, the connecting side 401 may also include, for example, a latch 405 for facilitating in fixing the sleeve 400 to the second shaft member 300, but the invention is not limited thereto. The guide groove 410A is divided into end portions 412A and 412B and a middle section 412C connected between the end portions 412A and 412B. Therein, a first gap D exists between the end portions 412A and 412B along the axis R, and a second gap E exists between the middle section 412C and the connecting side 401 along the axis R. Namely, in the present embodiment, the middle section 412C of the guide groove 410A may be, for example, parallel to a surface perpendicular to the axis R, and when the first ball 500 is located in the middle section 412C, the first shaft member 200 and the second shaft member 300 are rotated relatively to each other with a fixed distance, such that the overall rotation of the first shaft member 200 and the second shaft member 300 is displaced by means of the first gap D between the two end portions 412A and 412B.

To be more specific, the second gap E between the middle section 412C and the connecting side 401 is greater than a distance from each of the end portions 412A and 412B to the connecting side 401. That is, there is a maximum distance existing between the first shaft member 200 and the second shaft member 300 during the first ball 500 rolling in the middle section 412C, such that the collision between the first body 52 connected with the first shaft member 200 and the second body 54 connected with the second shaft member 300 may be mitigated during the rotation to provide a capability of safe rotation.

Figure 5:
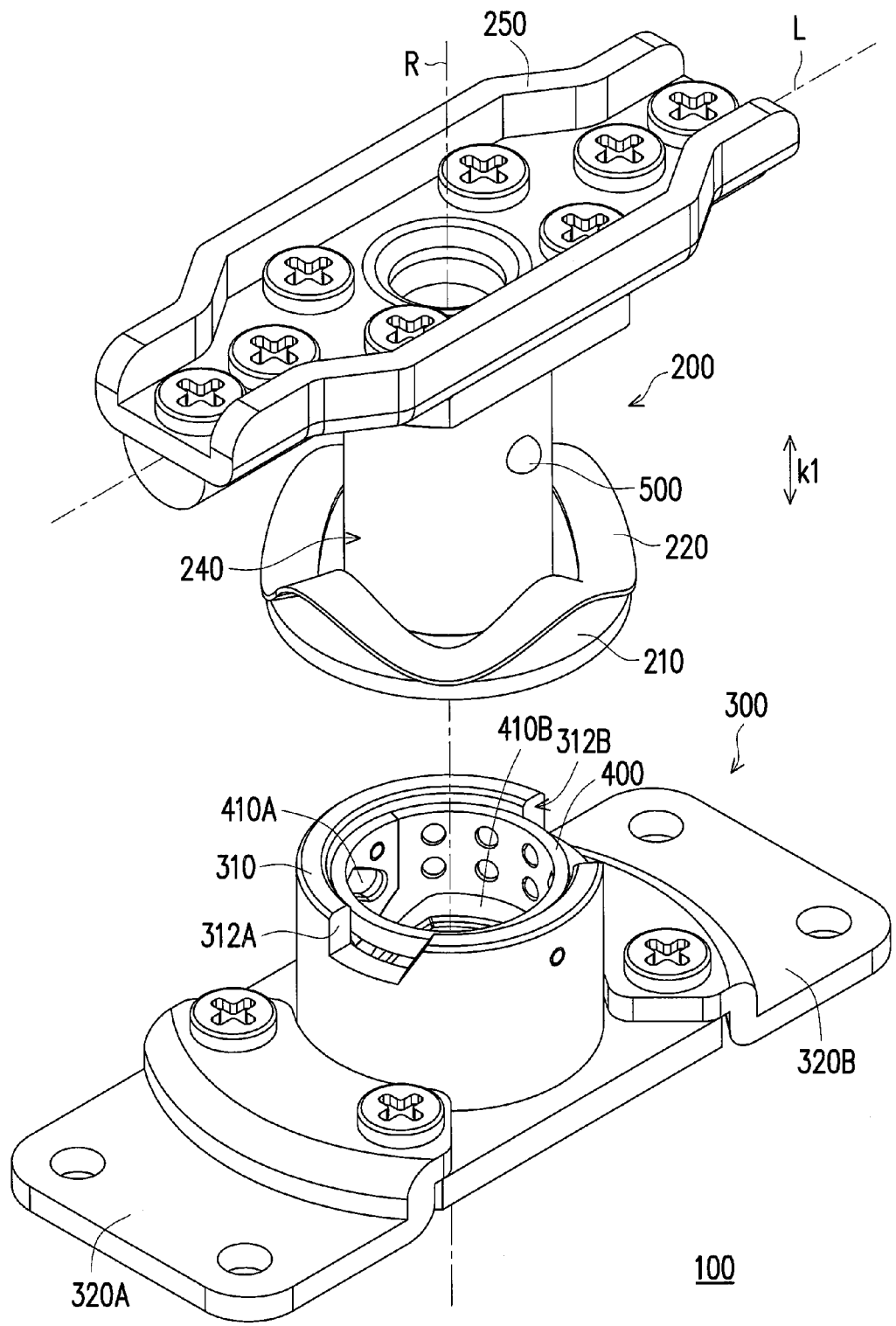
FIG. 5 is a partially exploded diagram illustrating the hinge module according to an embodiment of the invention.

FIG. 5 is a partially exploded diagram illustrating the hinge module according to an embodiment of the invention. Referring to FIG. 5, the first shaft member 200 further includes a stopping member 210 and an elastic member 220. The first shaft member 200 passes through the second shaft member 300, and the stopping member 210 is disposed at one end second shaft member 300 from which the first shaft member 200 comes out. The elastic member 220 is disposed between the stopping member 210 and the second shaft member 300 and pushes the stopping member 210 and the second shaft member 300 constantly along a direction k1 parallel to the axis R. Referring to FIG. 2A through FIG. 2C together, the connecting side 401 is disposed between each of the guide grooves 410A and 410B and the elastic member 220, and the elastic member 220 is disposed between the connecting side 401 and the stopping member 210. Namely, by means of the elastic member 220 pushing the stopping member 210, the first shaft member 200 and the second shaft member 300 may stop at an appropriate angle during the rotation. In other words, when being located in the middle section 412C, the first ball 500 does not slide in any way, which facilitates in stable rotation between the bodies of the electronic device equipped with the hinge module 100.

Referring to FIG. 1A and FIG. 5, in the present embodiment, the first shaft member 200 has a bump 230 protruding along the axis R. The second shaft member 300 includes a side wall 310 surrounding the sleeve 400 around the axis R. A distance between the side wall 310 and the axis R is equal to a distance between the bump 230 and the axis R. The side wall 310 has two recesses 312A and 312B on a side thereof facing the first shaft member 200 along the axis R. When the first shaft member 200 and the second shaft member 300 are rotated until the first ball 500 reaches the bottom of one of the end portions (as shown in FIG. 1A), the bump 230 is stopped in the recess 312A. On the other hand, when the first shaft member 200 and the second shaft member 300 are rotated until the first ball 500 reaches the bottom of the other one of the end portions (as shown in FIG. 1C), the bump 230 is stopped in the recess 312B. With the recesses 312A and 312B of the side wall 310, the first shaft member 200 and the second shaft member 300 of the hinge module 100 are rotated with each other, without being rotated excessively in an unnecessary angle, such that the electronic device connected to the hinge module 100 may be prevented from being damaged.

Referring to FIG. 4A, FIG. 4B and FIG. 5, in the present embodiment, the first body 52 is connected to the first shaft member 200 in a pivoting manner, and the first body 52 is used to be rotated with the first shaft member 200 around another axis L, in which the axis L is perpendicular to the axis R around which the first shaft member 200 and the second shaft member 300 are rotated relatively to each other. To be more detailed, the first shaft member 200 is connected to the first body 52 through a connecting member 250, and the first shaft member 200 and the first body 52 may be rotated around the axis L. On the other hand, the second shaft member 300 is fixed to the second body through fixing structures 320A and 320B, and in this way, the electronic device 50 may be opened and closed like a notebook computer.

In light of the foregoing, in the hinge module provided by the invention, while the first shaft member and the second shaft member are rotated around an axis relatively to each other, the first ball moves along the guide groove, so as to shift the position of the first shaft member relative to the second shaft member and in this way, to drive the first shaft member to displace from the second shaft member. In the electronic device provided by the invention, while the first body and the second body are rotated relatively to each other, the distance between the first body and the second body is changed along the axial direction by means of the displacement between the first shaft member connected to the first body and the second shaft member connected to the second body occurring during the rotation, such that a better and safer rotation function can be provided.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A hinge module, comprising:
   a first shaft member;
   a second shaft member with a hollow portion therein, the first shaft member being rotatably inserted in the hollow portion of the second shaft member along an axis;
   a sleeve, inserted in the hollow portion of the second shaft along the axis, disposed between the first shaft member and the second shaft member, connected to the second shaft member and comprising at least one guide groove, wherein the at least one guide groove extends around the axis and has a first gap along the axis; and
   at least one first ball, disposed on the first shaft member and rotatably coupled to the guide groove, wherein when the first shaft member is rotated relatively to the second shaft member around the axis, the first shaft member is rotated around the axis relatively to the second shaft member to move along the axis a distance equal to the first gap by rolling the first ball in the guide groove.

2. The hinge module according to claim 1, wherein the guide groove has a carrying surface facing the first shaft member, and the first ball is rotatably located between and contacts with the carrying surface and an outer surface of the first shaft member.

3. The hinge module according to claim 1, wherein the sleeve is connected to the second shaft member with a connecting side, the guide groove is divided into two end portions and a middle section connected between the two end portions, the first gap exists between the two end portions along the axis, and a second gap exists between the middle section and the connecting side along the axis, wherein the second gap is greater than the first gap.

4. The hinge module according to claim 3, wherein the second gap is greater than a distance between each of the two end portions and the connecting side along the axis.

5. The hinge module according to claim 3, wherein the first shaft member further comprises a stopping member and an elastic member, the first shaft member passes through the second shaft member, the stopping member is disposed at one end of the second shaft member from which the first shaft member comes out, the elastic member is disposed between the stopping member and the second shaft member and pushes the stopping member and the second shaft member constantly along a direction parallel to the axis, wherein the connecting side is disposed between the at least one guide groove and the elastic member, and the elastic member is disposed between the connecting side and the stopping member.

6. The hinge module according to claim 3, wherein the first shaft member has a bump protruding along the axis, the second shaft member has a side wall surrounding the sleeve around the axis, a distance between the side wall and the axis is equal to a distance between the bump and the axis, the side wall has two recesses on a side thereof facing the first shaft member along the axis, and when the first shaft member and the second shaft member are rotated until the first ball reaches the bottom of one of the two end portions, the bump is stopped in one of the two recesses.

7. The hinge module according to claim 1, further comprising:
a plurality of second balls, rotatably embedded in the sleeve, located between and rotatably contacting with the first shaft member and the second shaft member.

8. An electronic device, comprising:
a first body;
a second body; and
a hinge module, comprising:
a first shaft member, connected to the first body;
a second shaft member with a hollow portion therein, connected to the second body, and the first shaft member being rotatably inserted in the hollow portion of the second shaft member along an axis, such that the first body is rotated around the axis relatively to the second body;
a sleeve, inserted in the hollow portion of the second shaft along the axis, disposed between the first shaft member and the second shaft member, connected to the second shaft member and comprising at least one guide groove, wherein the at least one guide groove extends around the axis; and
at least one first ball, disposed on the first shaft member and rotatably coupled to the guide groove, wherein when the first shaft member is rotated relatively to the second shaft member around the axis, the first shaft member s rotated around the axis relatively to the second shaft member by rolling the first ball in the guide groove, so as to change a distance between the first body and the second body.

9. The electronic device according to claim 8, wherein the guide groove has a carrying surface facing the first shaft member, and the first ball is located between and rotatably contacts with the carrying surface and an outer surface of the first shaft member.

10. The electronic device according to claim 8, wherein the sleeve is connected to the second shaft member with a connecting side, the guide groove is divided into two end portions and a middle section connected between the two end portions, a first gap exists between the two end portions along the axis, and a second gap exists between the middle section and the connecting side along the axis, wherein the second gap is greater than the first gap.

11. The electronic device according to claim 10, wherein the second gap is greater than a distance between each of the two end portions and the connecting side along the axis.

12. The electronic device according to claim 10, wherein the first shaft member further comprises a stopping member and an elastic member, the first shaft member passes through the second shaft member, the stopping member is disposed at one end of the second shaft member from which the first shaft member comes out, the elastic member is disposed between the stopping member and the second shaft member and pushes the stopping member and the second shaft member constantly along a direction parallel to the axis, wherein the connecting side is disposed between the at least one guide groove and the elastic member, and the elastic member is disposed between the connecting side and the stopping member.

13. The electronic device according to claim 8, further comprising:
a plurality of second balls, rotatably embedded in the sleeve, located between and rotatably contacting with the first shaft member and the second shaft member.

14. The electronic device according to claim 8, wherein the first shaft member has a bump protruding along the axis, the second shaft member has a side wall surrounding the sleeve around the axis, a distance between the side wall and the axis is equal to a distance between the bump and the axis, the side wall has two recesses on a side thereof facing the first shaft member along the axis, when the first shaft member and the second shaft member are rotated until the first ball reaches one of the two end portions, the bump is stopped in one of the two recesses.

* * * * *